United States Patent [19]

Jambotkar et al.

[11] 4,294,002
[45] Oct. 13, 1981

[54] MAKING A SHORT-CHANNEL FET

[75] Inventors: Chakrapani G. Jambotkar, Hopewell Junction; Paul P. Wang, Kingston, both of N.Y.

[73] Assignee: International Business Machines Corp., Armonk, N.Y.

[21] Appl. No.: 41,023

[22] Filed: May 21, 1979

[51] Int. Cl.³ .................................. H01L 21/26
[52] U.S. Cl. .................... 29/571; 29/576 B; 148/1.5; 148/187
[58] Field of Search ............. 29/571, 576 B; 148/187, 148/1.5

[56] References Cited

U.S. PATENT DOCUMENTS 3,996,655 12/1976 Cunningham et al. .......... 148/1.5 X
4,038,107 7/1977 Marr et al. ........................ 148/1.5
4,173,818 11/1979 Bassous ............................. 29/571
4,208,780 6/1980 Richman ........................... 29/571

Primary Examiner—G. Ozaki
Attorney, Agent, or Firm—James E. Murray

[57] ABSTRACT

An improved Field Effect Transistor (FET) with a very small effective channel length is made by using, a first ion implantation to produce the source and drain regions of the FET and a second very shallow ion implantation next to the source region to produce the effective short channel of the FET. The effective channel of the FET is implanted to only a small fraction of the depth of the source and drain. The use of implantations instead of diffusions in the described manner in combination with the use of the shallow effective channel in the FET provides superior control over the threshold voltage of the FET and increases the operating speed of the FET.

8 Claims, 18 Drawing Figures

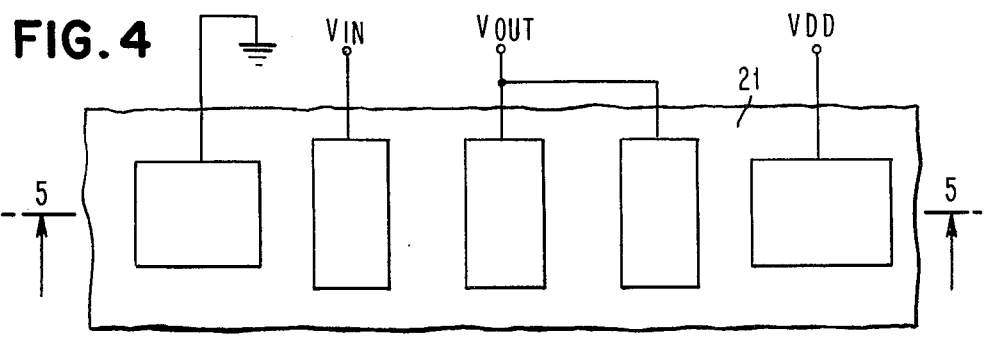
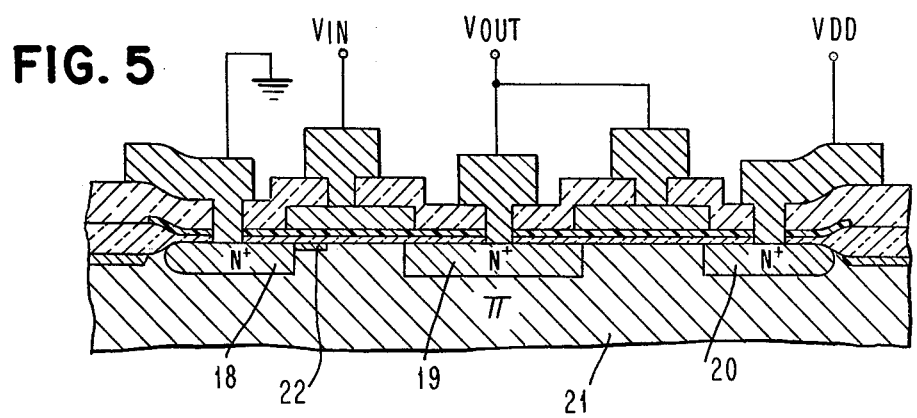
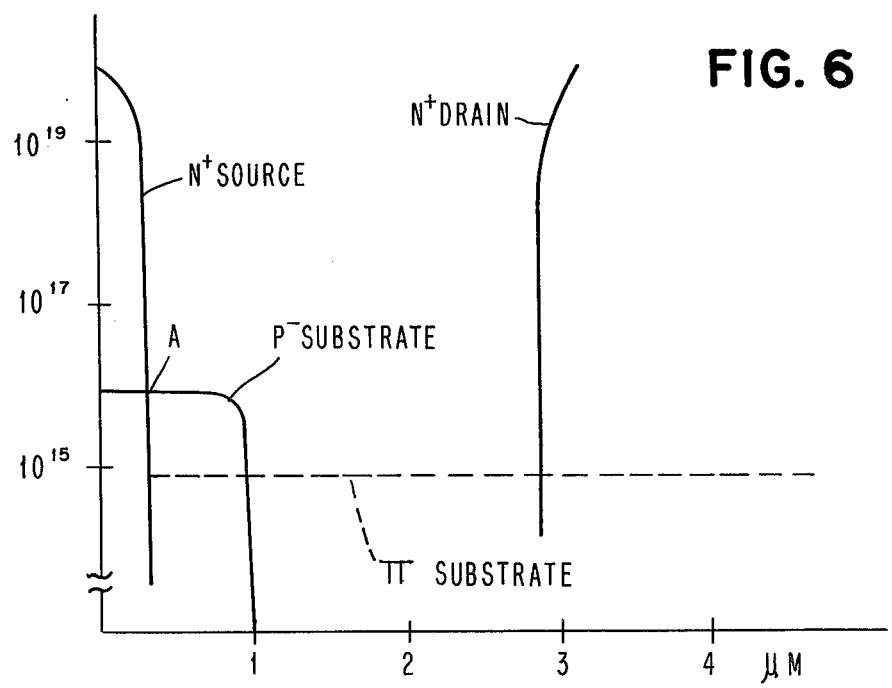

MAKING A SHORT-CHANNEL FET

BACKGROUND OF THE INVENTION

This invention relates to a process for fabrication of Insulated Gate Field Effect Transistors (IGFETs) and, more specifically to short-channel enhancement mode IGFETs.

It is well known in the art that the frequency response or switching speed of an IGFET improves as the channel length and parasitic capacitances of the IGFET are reduced in magnitude. The reason for this is that a reduction in channel length reduces the transit time for carriers travelling between source and drain, while a reduction in the parasitic capacitances decreases the time required for charging and discharging the capacitances. Double-diffused metal oxide semiconductors (D/MOS) such as the one described in Cunningham et al U.S. Pat. No. 3,996,655, are short-channel IGFETs with reduced parasitic capacitances. In a typical N-channel D/MOS type device, a substrate with very low $\pi$ type impurity concentration has source and drain regions having an N+ type impurity diffused therein in the typical MOS fashion. What is distinguishing about the D/MOS construction is that the N+ source region is set within a larger and deeper diffusion of P- impurity which effectively provides a narrow P- type channel adjacent to the source, while the $\pi$ type region between the P-type diffusion and the N+ type drain diffusion functions as a drift region.

With this D/MOS construction, very short channel lengths are realizable by properly controlling the N+ and P- diffusions in and around the source region. Furthermore, in a D/MOS the parasitic drain-to-substrate capacitance is smaller than a conventional short-channel MOS device, because the N+ drain diffusion of the D/MOS is surrounded by the substrate having a very low $\pi$ type impurity. However, the P-channel diffusion around the source diffusion still maintains the substantial capacitance at the periphery of the source region just as in a conventional FET. Furthermore, for reasons that will be discussed later in the description, the threshold voltage of a D/MOS varies considerably from unit to unit.

BRIEF DESCRIPTION OF THE INVENTION

In accordance with the present invention, stray capacitances at the peripheries of both source and drain regions are substantially reduced and the threshold voltage is made much less variant from unit to unit by the provision of a new type of FET. In fabricating this new FET, a first ion implantation is used to produce the source and drain regions of the FET and a second very shallow ion implantation next to the source region is used to produce the effective short channel of the FET. The channel of the FET is implanted to only a small fraction of the depth of the source and drain, the impurity concentration being maintained uniform along the length of the effective channel. The use of implantation steps in the described manner in combination with the use of a shallow effective channel in the FET permits superior manufacturing control over the threshold voltage and significantly reduces the stray capacitances.

Therefore, it is an object of the present invention to provide a new type of FET.

It is another object of the invention to provide a new method of forming an FET.

It is a further object of the invention to provide an FET that can be fabricated with other devices on a monolithic chip.

DESCRIPTION OF THE DRAWING

The above objects and other objects of the invention will be apparent after consideration of the following figures of the preferred embodiments of the invention in which:

FIG. 4 is a plan view of a portion of a semiconductor chip containing the circuit of FIG. 1 wherein the one of the transistors is a short-channel FET in accordance with the present invention;

FIG. 5 is a section along line 5—5 of FIG. 4;

FIG. 6 is an impurity concentration profile for the semiconductor chip of FIGS. 4 and 5;

DETAILED DESCRIPTION

Figure 1:
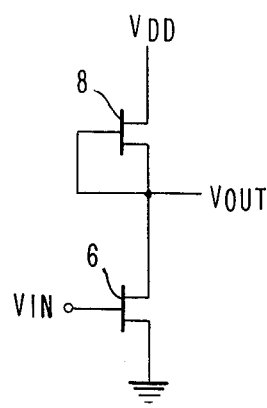
FIG. 1 is a circuit diagram of two FET transistors connected in series.
Figure 2:
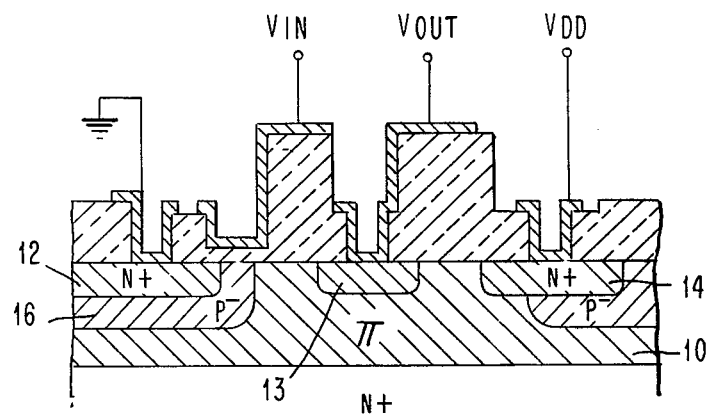
FIG. 2 is a sectional view of a portion of a semiconductor chip containing the circuit of FIG. 1 where one of the devices is a prior art D/MOS transistor.

FIG. 1 shows an enhancement mode FET 6 connected to a depletion mode FET 8 in series between an electrical potential of excitation $V_{DD}$ and ground. FIG. 2 is a cross section of a chip containing that circuit produced in accordance the previously mentioned patent. As shown, the circuit is formed by a substrate 10 of $\pi$ material which has N+ source and drain diffusions 12, 13 and 14, for the two devices therein. Surrounding the source diffusion for the enhancement mode D/MOS type device there is a P-diffusion 16 which provides the effective channel of that device.

Figure 3:
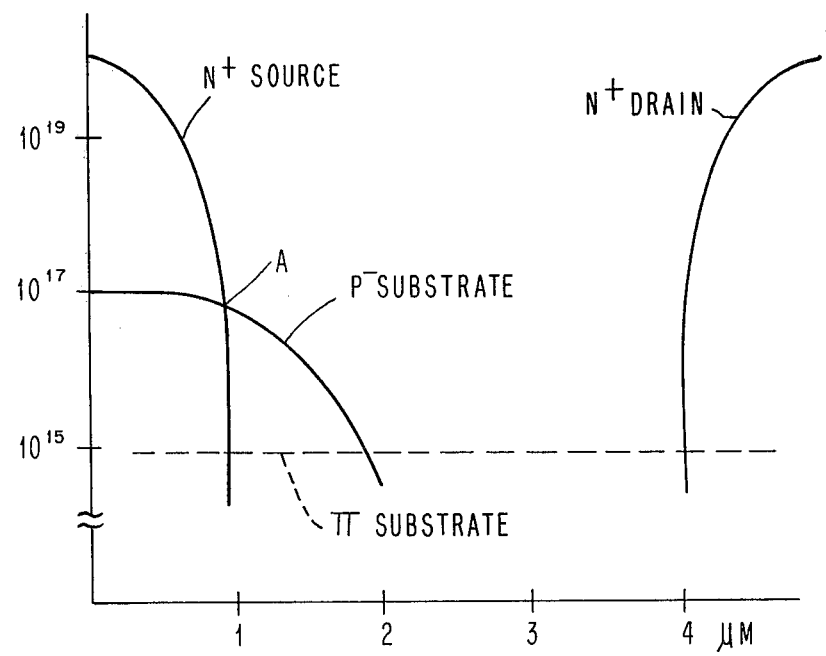
FIG. 3 is an impurity concentration profile for the semiconductor chip of FIG. 2.

FIG. 3 is an impurity concentration profile for the enhancement mode D/MOS type FET of FIG. 2 in which the distance along the silicon surface from the source opening edge toward the drain opening edge of the FET is plotted on the x-axis, while the impurity concentration of the device is plotted on the y-axis. The threshold voltage, $V_{TE}$, of the D/MOS FET in FIG. 2 is determined by the P- impurity concentration at the intersection point A of the N+ and P- diffusions. With state-of-the-art diffusion processes, it is difficult to control the magnitude of the P-impurity concentration at the intersection point A because the concentration profiles of impurities for both the N+ and P- diffusions vary from time to time.

In accordance with the present invention, enhancement FET's with short channels are realized without resorting to the use of a multiple-step diffusion in the source region to generate the short channel. As shown in FIGS. 4 and 5, the N+ source and drain regions 18, 19 and 20 are ion-implanted in a $\pi$ substrate 21 during one process step and then, in a later process step, the P-channel region 22 is ion-implanted in a region adjacent to the source region of the enhancement FET. The concentration profile of this short-channel FET is shown in FIG. 6. As can be seen, the concentration profile of the P- region 22 is uniform at and around the intersection point A along the silicon surface. This is because the state-of-the-art of ion implantation permits a very precise control over the concentration of impurities introduced in a substrate. Further, the process sequence described below, is specifically arranged to avoid any high-temperature heat cycles subsequent to the ion implantation so that the concentration profiles of the impurities remain practically invariant after implantation. As a consequence, the threshold voltage $V_{TE}$ of the enhancement FET remains substantially invariant from unit to unit. Also, the use of ion implantation steps instead of diffusion steps allows greater control over the effective channel length. Furthermore, as a result of the P- channel implantation being confined to only a small fraction of the depth of the source region, the source-to-substrate capacitance is minimized to the same extent as the drain-to-substrate capacitance.

Figure 7:
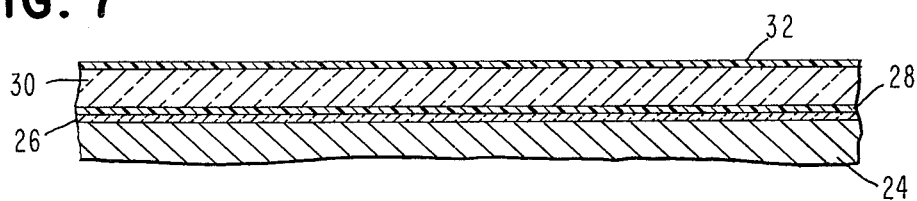
FIGS. 7 through 16 are sectional views illustrating processing of the FET in accordance with the present invention.

In FIGS. 7 to 16 it can be seen how a short-channel enhancement mode FET of the present invention can be fabricated simultaneously with a depletion mode FET. FIG. 7 shows a $\pi$ type silicon substrate 24 with a resistivity typically of 20–100 ohm-cm. Grown on this substrate is an approximately 300 Å thick thermal $SiO_2$ layer 26 and successively deposited on the $SiO_2$ layer 26 are a layer 28 of $Si_3N_4$, a layer 30 of polysilicon and a layer 32 of pyrolitic $SiO_2$ having typical thicknesses of 300 Å, 8500 Å and 1000 Å respectively.

Figure 8:
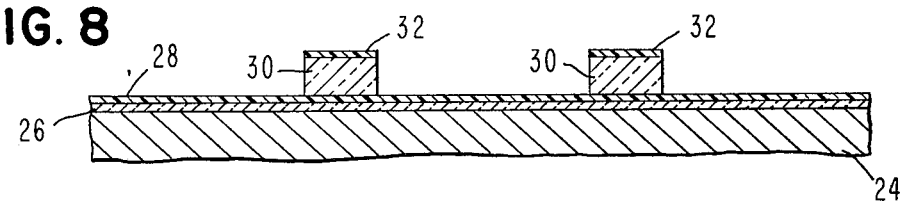
Figure 9:
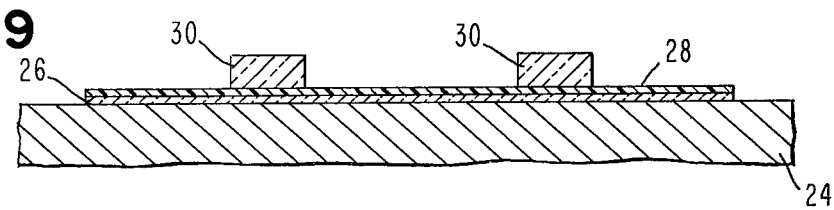

As shown in FIG. 8, conventional photolithography is used to selectively etch the pyrolitic $SiO_2$ and polysilicon layers 32 and 30. Thereafter, as shown in FIG. 9, the remnant $SiO_2$ layer 32 is removed by dipetching and then the $Si_3N_4$ layer 28 and the $SiO_2$ layer 26 are photolithographically masked and selectively etched, preferably using reactive ion etching. This leaves a rectangular portion of the substrate 24 still covered with the $Si_3N_4$ and $SiO_2$ layers and that rectangular portion is partially covered by two stripes of polysilicon 30.

Figure 10:
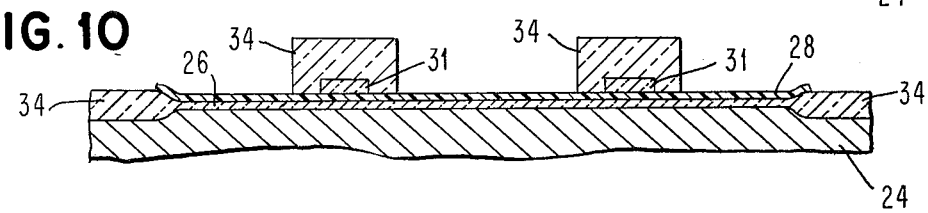

As illustrated in FIG. 10, a thermal $SiO_2$ layer 34 is grown over the exposed surface of the substrate 24 and also on the top and side surfaces of the polysilicon layer 30 oxidizing a portion of the polysilicon layer in the process. The unoxidized portion of the original polysilicon layer 30 is identified as 31 in FIG. 10. $SiO_2$ 34 does not grow over the exposed $Si_3N_4$ layer 28 except where growth on the sidewalls of the polysilicon layer 31 overlies the exposed surface of $Si_3N_4$ layer 28. The thickness of the $SiO_2$ layer 34 on both the top and side walls of the polysilicon is designed to be equal to the desired effective channel length of the enhancement FET, one micrometer being a typical value.

Figure 11:
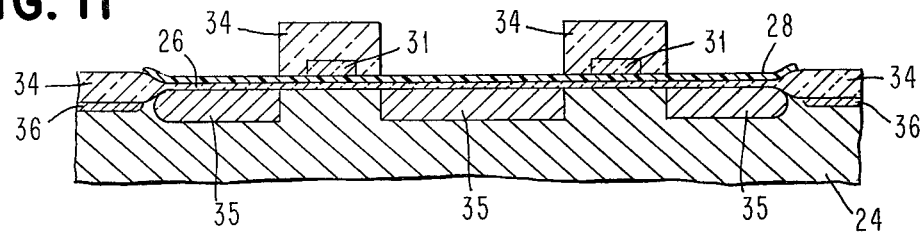
Figure 12:
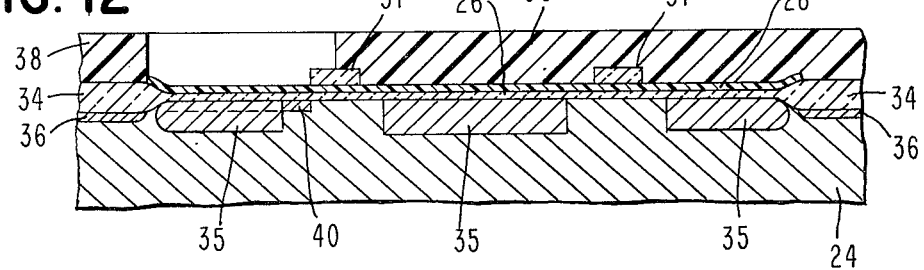

Using $SiO_2$ layer 34 as a mask, an N+ type impurity, such as phosphorus, is then ion-planted into the substrate to a junction depth of about $0.7\mu$ to form the source and drain regions 35 for the enhancement and deletion mode FET's as shown in FIG. 11. Typical suitable doses and energies for two successive implantations of phosphorus are (a) $3\times10^{15}$ ions/cm$^2$ at 400 kev and (b) $5\times10^{15}$ ions/cm$^2$ at 150 kev. The magnitude of the junction depth of source and drain added to the magnitudes of thicknesses of $SiO_2$ layer 26 and $Si_3N_4$ layer 28 is, by design, less than the thickness of $SiO_2$ layer 34.

A layer of developed photoresist is now used and ion implantation is used to deposit a skin layer 36 of a P- type impurity such as boron to form channel stopper regions. The typical suitable dose and energy for the boron in the channel stopper region are $8\times10^{11}$ ions/cm$^2$ and 400 kev, respectively. After completion of the channel-stopper ion implantation step, developed photoresist is used to cover $SiO_2$ in the "field" region and the $SiO_2$ 34 covering the polysilicon 31 is etched away. The photoresist is stripped and a new layer 38 of developed photoresist is used to cover areas excepting the short-channel regions and portions of the source regions of the enhancement FET's in the immediate vicinity of the channel regions. Ion implantation is now used to deposit a skin layer of a P- type impurity 40, such as boron, in the substrate. This implantation is done to a depth of about 0.03 to 0.25 of the depth of the implantation of the source and drain regions. See FIG. 12. The typical suitable dose and energy for implant of boron in this "effective" channel region of the enhancement FET are $6\times10^{10}$ ions/cm$^2$ and 20 kev, respectively. The P- type impurity, introduced in the heavily doped N+ source regions of the enhancement FET's gets overcompensated.

Figure 13:
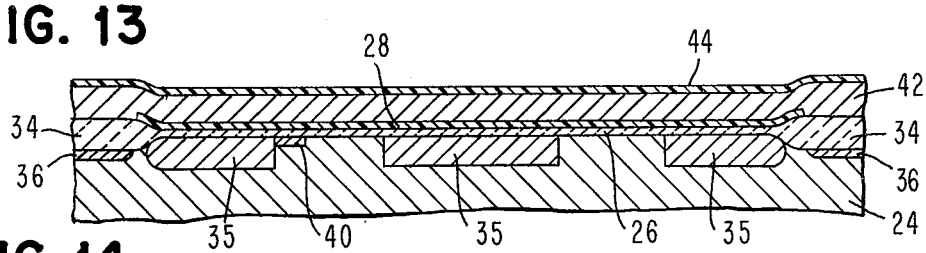

As shown in FIG. 13, the remnant polysilicon layer 31 is removed by dip-etching and new layers of N+ doped polysilicon 42 and pyrolytic $SiO_2$ layer 44 are deposited over the whole surface. Thicknesses of the layers 42 and 44 are approximately 8000 Å and 1000 Å respectively. If desired, the remnant silicon nitride layer 28 can be removed by dip-etching prior to deposition of layers 42 and 44.

Figure 14:
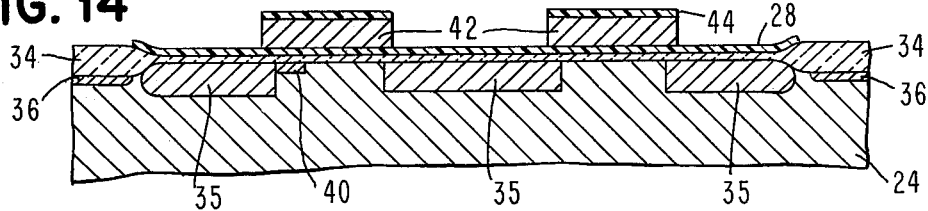
Figure 15:
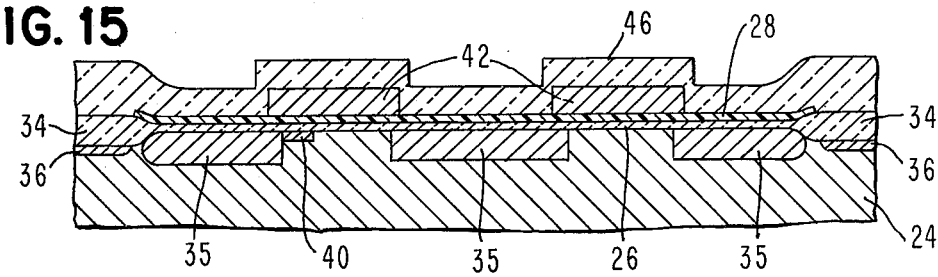
Figure 16:
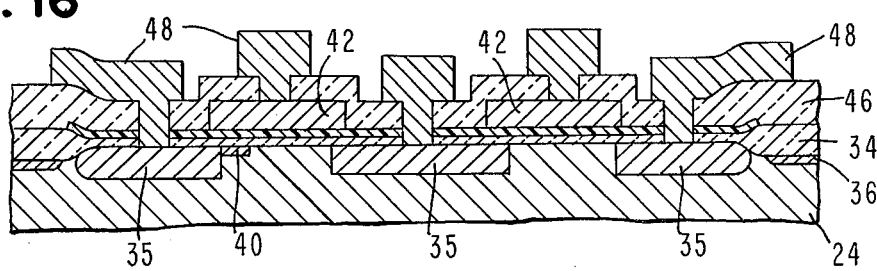

The newly deposited layers 42 and 44 are then selectively etched as shown in FIG. 14 to define the polysilicon gates for the enhancement and depletion FET's and thereafter an approximately 5000 Å thick layer 46 of pyrolytic $SiO_2$ is deposited over the whole surface as illustrated in FIG. 15.

Therefore, photolithography is used to selectively etch regions for metal contacts to the polysilicon gates 42 and the source and drain regions 35. A metal 48 such as aluminum, about one micrometer in thickness, is deposited and interconnection patterns are formed in the metal film through photolithography. After annealing the metal, the substrate processing can be finished using standard procedures of passivation, chip dicing, etc.

With the described procedure, the effective channel length of the enhancement FET's is equal to the thickness of the thermal $SiO_2$ 34 grown on the sidewalls of the polysilicon 30. This is because once the impurities are implanted, there is virtually no diffusion movement of the impurities as a result of all ensuing heating cycles being at the low temperatures of at most 800°–850° C. With the current state-of-the-art, thickness of the thermal $SiO_2$ layer 34, and hence the effective channel length of the enhancement FET's, can be easily controlled with great precision at any micron or submicron value.

Figure 17:
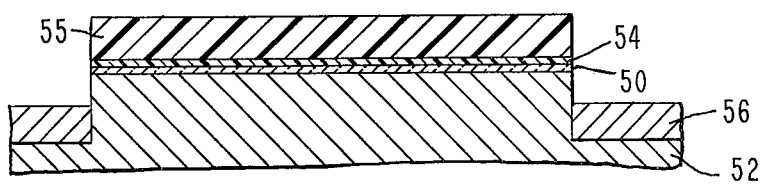
FIGS. 17 and 18 are sectional views illustrating processing of an alternate FET in accordance with the present invention.

The following embodiment is identical to the one described above except that the field $SiO_2$ is fully recessed rather than partially recessed and that the need for photolithography in the process steps realizing channel-stopping regions is eliminated. As shown in FIG. 17, an approximately 300 Å thick layer 50 of thermal $SiO_2$ is grown on a $\pi$ type silicon substrate 52 of about 20–100 ohm-cm resistivity. Thereafter, a 300 layer 54 of $Si_3N_4$ is deposited on the $SiO_2$ layer. Photoresist 55 is deposited and developed using a mask. Reactive ion etching is then used to etch $Si_3N_4$ layer 54, the $SiO_2$ layer 50 and the exposed silicon 52 to a depth of about 5500 Å in the exposed regions. With the photoresist still in place, ion implantation is used to deposit a P- type impurity such as boron in the exposed silicon. The implant dose and energy are chosen so as to realize, at the end of all wafer processing, a P-type "channel-stopping" region 56 with a typical concentration of $3 \times 10^{16}$ a/cc at the interface of the field $SiO_2$ and silicon substrate.

Figure 18:
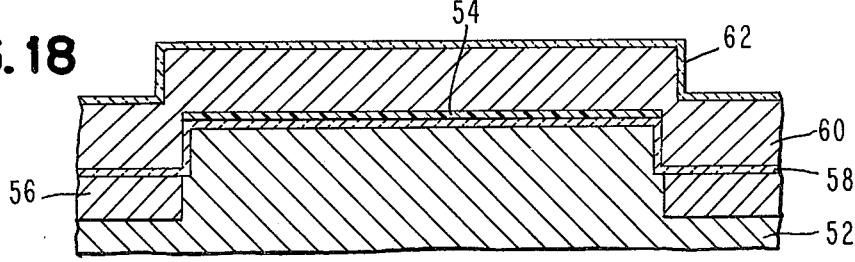

The photoresist 55 is then removed and 500 Å thick layer 58 of $SiO_2$ is deposited on the exposed silicon as shown in FIG. 18. Thereafter, an approximately 8.5 KÅ thick polysilicon layer 60 and an approximately 1 KÅ thick pyrolytic $SiO_2$ layer 62 are deposited. The remainder of the processing is the same as described previously in connection with FIGS. 8 through 16 with the exception of the elimination of the steps concerning the channel-stopping region.

We have described above two different ways of making an enhancement and a depletion mode device in an area isolated from other devices on the same chip. The other devices on the same chip may be the same as or different than the two described devices. Therefore, it should be obvious to those skilled in the art that many changes can be made in the above embodiment of the invention without departing from the spirit and scope of the invention.

Having thus described our invention, what we claim as new, and desire to secure by Letters Patent is:

1. A method for forming a field effect transistor which comprises:
   (a) ion-implanting an impurity of one conductivity type into two areas on a major face of a second conductivity type substrate of substantially low conductivity to a first depth to form two closed, spaced regions of one conductivity type to function as the source and drain of the field effect transistor;
   (b) ion implanting an impurity of the second conductivity type into a third area including at least a portion of the first of said two areas and a portion of the area between the two regions to a second depth which is only a small fraction of the first depth to form a third region of the said second conductivity type adjacent to the first of the said two regions but spaced from the second of the two said regions to function as the effective channel of the field effect transistor;
   (c) forming a gate for the field effect transistor insulated from the said low conductivity substrate over the third region; and
   (d) forming electrical contacts to the said two closed spaced regions and the said gate to provide connections to the field effect transistor.

2. The method of forming a field effect transistor of claim 1 wherein said gate is a silicon gate.

3. The method of forming a field effect transistor of claim 1 wherein the second depth is between 0.03 and 0.25 of the first depth.

4. The method of forming a field effect transistor of claim 3 wherein said substrate is $\pi$ material, the two closed space regions are of N+ type conductivity and the third region is of P- type conductivity.

5. The method of forming a field effect transistor of claim 1 including performing all processing steps at a temperature no greater than 850° C. after said ion implantation steps.

6. The method of claim 1 wherein the ion implantation of the second conductivity type is performed after the ion implantation of the one conductivity type.

7. A method of forming a field effect transistor which comprises:
   forming a passivation layer over a closed portion of a major face of a silicon semiconductor substrate of one conductivity type,
   forming a polysilicon layer over a part of the closed portion so as to leave two separated areas of said closed portion not covered by the polysilicon layer,
   growing a $SiO_2$ layer on said major face including a controlled oxidation of a portion of the polysilicon layer thereby reducing the size of the two spaced regions of the closed portion which are not covered by said $SiO_2$ layer,
   ion implanting an impurity of a second conductivity type into said two spaced regions to a first depth in a first ion implanting step using said $SiO_2$ layer as a mask so that said spaced regions can function as the source and drain of a field effect transistor,
   removing said $SiO_2$ layer including oxidized polysilicon thereby enlarging said two separated areas not covered by the polysilicon layer,
   ion implanting an impurity of the first conductivity type into one of the two enlarged separate areas not covered by the polysilicon layer to a small fraction of the first depth using the polysilicon layer as a partial mask to form a third region of said second conductivity type adjacent to one of the two separated regions but separated from the other of the two separated regions to function as the effective channel of the field effect transistor,
   forming a gate for the field effect transistor insulated from the said substrate over the third region; and
   forming electrical contacts to the said two closed spaced regions and the said gate to provide connections to the field effect transistor.

8. The method of claim 7 wherein said covering layer is $Si_3N_4$.

* * * * *